(12) United States Patent
DiGiacomo

(10) Patent No.: US 6,329,721 B1
(45) Date of Patent: Dec. 11, 2001

(54) PB-IN-SN TALL C-4 FOR FATIGUE ENHANCEMENT

(75) Inventor: Giulio DiGiacomo, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/570,884

(22) Filed: May 15, 2000

Related U.S. Application Data

(62) Division of application No. 09/118,117, filed on Jul. 16, 1998, now Pat. No. 6,196,443, which is a division of application No. 08/898,443, filed on Jul. 22, 1997, now Pat. No. 6,025,649.

(51) Int. Cl.$^7$ .......................... H01L 23/48; H01L 23/52; H01L 29/40
(52) U.S. Cl. .......................... 257/779; 257/772; 257/781
(58) Field of Search .................. 257/779, 772, 257/781, 780; 438/612, 614; 228/180.22

(56) References Cited

U.S. PATENT DOCUMENTS

| | | | |
|---|---|---|---|
| 3,839,727 | 10/1974 | Herdzik et al. | 257/737 |
| 4,412,642 | 11/1983 | Fisher, Jr. | 228/173.1 |
| 4,651,191 | 3/1987 | Oowe et al. | 257/772 |
| 4,673,772 | 6/1987 | Satoh et al. | 228/185 |
| 5,075,965 * | 12/1991 | Carey et al. | 29/840 |
| 5,244,143 | 9/1993 | Ference et al. | 228/253 |
| 5,251,806 | 10/1993 | Agarwala et al. | 228/254 |
| 5,269,453 | 12/1993 | Melton et al. | 228/195 |
| 5,308,578 | 5/1994 | Wong | 420/558 |
| 5,391,514 | 2/1995 | Gall et al. | 438/108 |
| 5,496,770 | 3/1996 | Park | 438/613 |
| 5,509,815 | 4/1996 | Jin et al. | 439/91 |
| 5,532,612 | 7/1996 | Liang | 324/760 |
| 5,542,174 | 8/1996 | Chiu | 29/840 |
| 5,551,627 | 9/1996 | Leicht et al. | 228/180.22 |
| 5,634,268 | 6/1997 | Dalal et al. | 29/840 |
| 5,729,896 | 3/1998 | Dalal et al. | 29/840 |
| 5,796,591 | 8/1998 | Dalal et al. | 257/738 |
| 5,959,341 * | 9/1999 | Tsuno et al. | 257/467 |
| 5,977,637 * | 11/1999 | Akamatsu et al. | 257/772 |

OTHER PUBLICATIONS

IBM Technical Disclosure Bulletin vol. 22 No. 3 Method To Change Solder Composition of Chip Aug., 1979.
IBM Technical Disclosure Bulletin vol. 17 No. 4 Indium –Lead Solder For Component Mounting Sep., 1974.
Microelectronics Packaging Handbook pp. 361–391 Edited by: Rao R. Tummaia, Eugene J. Rymaszewski, 1989.
IBM Technical Disclousre Bulletin vol. 11 No. 11, p. 1528; Indium–Lead–Indium Chip Joining, Dawson et al.; Apr. 1969.

* cited by examiner

*Primary Examiner*—Phat X. Cao
(74) *Attorney, Agent, or Firm*—DeLio & Peterson, LLC; John J. Tomaszewski; Margaret A. Pepper

(57) ABSTRACT

A solder column structure particularly useful for joining electronic components by C-4 interconnection is provided comprising a solder column attached at one end to one of the substrates being joined and having a layer of indium at the other end. During reflow, to join the other substrate, the indium melts with part of the solder column forming a Pb—Sn—In ternary alloy joint having enhanced fatigue resistance. A method for using the solder column to make electronic component assemblies and electronic component assemblies made using the method and solder column are also provided.

6 Claims, 4 Drawing Sheets

PB-IN-SN TALL C-4 FOR FATIGUE ENHANCEMENT

This is a a divisional of application Ser. No. 09/118,117 filed on Jul. 16, 1998 U.S. Pat. No. 6,196,443, which is a divisional application of Ser. No. 08/898,443 filed on Jul. 22, 1997, now U.S. Pat. No. 6,025,649.

BACKGROUND OF THE INVENTION

1. Field of the Invention

This invention relates to a solder structure in the form of a column which structure provides enhanced fatigue life properties when reflowed and used to bond substrates and, more particularly, to a solder structure having a metal portion at one end thereof which forms an alloy with solder and which structure is used to make C-4 connections in electronic components such as joining a chip to a substrate.

2. Description of Related Art

The use of solder to join materials such as components of an electronic structure is well known in the art. In the electronics area there are a myriad of electronic components which require connection to other electronic components or to other levels of packaging. Examples include mounting of integrated circuit chips to a metallized substrate, multilayer ceramic substrate, laminate organic substrate, glass ceramic substrate, card (direct-chip-attach, DCA), and any substrate made of composite materials meeting thermal and mechanical properties.

For the sake of clarity and consistency in describing the present invention the specification will be directed to electronic components made using Controlled Collapse Chip Connection (C-4) technology and, in particular, to the use of C-4 solder columns as compared with spherical solder bumps.

C-4 technology is an interconnection technology developed by IBM as an alternative to wire bonding. Broadly stated, in one application, one or more integrated circuit chips are mounted above a single or multilayer substrate and pads on the chip are electrically connected to corresponding pads on the substrate by a plurality of electrical connections known as solder bumps or solder columns. An example of a C-4 configuration is a square grid array which is 11 C-4 pads long by 11 C-4 pads wide on 10 mil centers. A five mil solder bump is located at every intersection in the grid except one which is typically displaced for orientation purposes. A popular chip is a circuit "computer-on-a-chip" which has 762 C-4 solder bumps in a 29×29 area array.

The C-4 technology has also extended to other applications and is now used on thin-film resistor and composite chips in hybrid modular applications. Solder pads for this application are very large-about 25 mil in diameter. At the other extreme, C-4s have been used for precision registration and alignment in the joining of a GaAs wave guide. The most dense area array reported has been a 128×128 array of 1 mil bumps on about 2 mil centers resulting in 16,000 pads.

The C-4 technology typically utilizes spherical solder bumps deposited on solder wettable metal terminals on the chip and a matching foot print of solder wettable terminals on the substrate to be joined thereto. The upside-down chip (flip chip) is aligned to the substrate, and all joints are made simultaneously by reflowing the solder bumps. The flow on the chip is limited by a ball limiting metallurgy (BLM) pad which is generally a circular pad of evaporated, thin-film metal such as chromium, copper and gold that provides the sealing of the via as well as the solderable, conductive base for the solder bump. A very thick deposit of evaporated solder acts as the primary conduction and joining material between chip and substrate.

Melting point has been a consideration in the choice of solder alloys for C-4s. Lead solders, especially 95 Pb/5 Sn have been widely used with alumina ceramic substrates because of their high melting point of approximately 315° C. Their use for the chip connection allows other lower-melting point solders to be used at the module-to-card or card-to-board packaging level without remelting the chip's C-4s. Intermediate melting point solders such as eutectic 63 Sn/37 Pb (melting point 183° C.) and a 50 Pb/50In melting point of approximately 220° C. have been used. In "Microelectronics Packaging Handbook", edited by R. R. Tummala and Rymaszewski, 1989, van Nostrand Reinhold, pages 361–391, C-4 chip to package interconnections as well as typical solders used in C-4 technology are discussed and this reference is hereby incorporated by reference.

Once the solder bumps or columns are deposited on the BLM, the joining of the BLM of the chips to the substrate using C-4 technology is relatively straight forward. Flux, either water-white rosin for high-lead solders with water-soluble flux for low lead and other low-melting solders, is normally placed on the substrate to be joined as a temporary adhesive to hold the chips in place. Such an assembly is then subjected to a reflow thermal cycle wherein the pads on the chip and the pads on the substrate self-align due to the high-surface-tension forces of the solder to complete the assembly. Once the chip-joining operation is complete, cleaning of flux residues is accomplished with such solvents as chlorinated solvents or xylene. The assembly is then electrically tested.

New technologies are continuously increasing the number of C-4 interconnections per device, and/or the size of the chip, both of which affect the stresses on the solder interconnections. As chips become more and more dense, higher input/output counts will drive area arrays of terminals to as many as 155,000 pads on a 20 mm chip. This will result in the number of pads increasing while the pad sizes and spacings decrease. The new technologies will induce large strains to the solder joint and new solders and solder structures are needed to meet the fatigue requirements of these types interconnections.

Bearing in mind the problems and deficiencies of the prior art, it is therefore an object of the present invention to provide a solder and solder structure which provides enhanced fatigue life properties when used to bond substrates particularly electronic substrates such as a chip to a multilayer ceramic substrate.

It is another object of the present invention to provide a method for making C-4 solder interconnections, using the specially defined column solder structure of the invention.

A further object of the invention is to provide C-4 containing electronic structures made using the solder column structure and method of the invention.

Still other objects and advantages of the invention will in part be obvious and will in part be apparent from the specification.

SUMMARY OF THE INVENTION

The above and other objects, which will be apparent to those skilled in the art, are achieved by the present invention which relates in a first aspect to a solder structure preferably in the form of a column which, when used to bond electronic substrates together, forms an enhanced fatigue resistant solder bond the solder structure comprising a solder column attached at one end to pads or other bonding sites on one of the electronic substrates to be joined and having at the other end a layer of metal which forms a ternary alloy with the solder (preferably single phase) when the solder column is reflowed to join the other substrate. The metal layer is preferably indium.

It should be appreciated that the reflow temperature is preferably below the melting point of the solder and that the solder in contact with the metal layer melts at such a lower temperature due to the formation of a ternary alloy. The solder structure may be a solder column up to about 15 mils tall or higher, typically up to about 10 mils tall and having an indium (metal) thickness of up to about 1.5 mils or higher. A preferred solder column has a solder height of about 9 to 15 mils and a metal layer height of about 0.5 to 2 mils. The solder preferably comprises up to 3% by weight tin and the balance lead. The height of the column may be over three times its diameter (the ratio of height to diameter typically being termed the aspect ratio) with high aspect ratios providing enhanced fatigue resistance. In general, a C-4 column having a height over three (3) times its diameter will roughly have approximately twenty-five (25) times the fatigue life of a standard C-4 column having a 0.6 aspect ratio.

In another aspect of the present invention, a method is provided for making C-4 solder electrical interconnections in an electronic component assembly comprising the steps of:

applying solder to metallized pads on the surface of a first substrate of the electronic component and forming a solder structure preferably a column structure which structure is bonded to the pads;

forming a layer of metal, preferably indium, on the non-bonded end of the solder structure which metal melts during a reflow cycle to allow the column to bond pads on a second substrate to the corresponding pads on the first substrate and which metal forms a ternary alloy with the solder of the solder structure;

positioning the pads on the surface of the second substrate of the electronic component assembly to be joined proximate to the ends of the solder columns of the corresponding pads on the first substrate;

heating the substrates to a temperature sufficient to melt the indium and part of the solder column forming a solder-indium ternary alloy (Pb—Sn—In)and alloy bond between the solder structure and the pads on the second substrate; and cooling the bonded interconnected assembly.

In a further aspect of the invention, electronic assemblies made by the above method are also provided with the electronic assemblies comprising electronic components joined together, the components including a multilayer ceramic substrate and a semiconductor chip.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

Figure 1A:
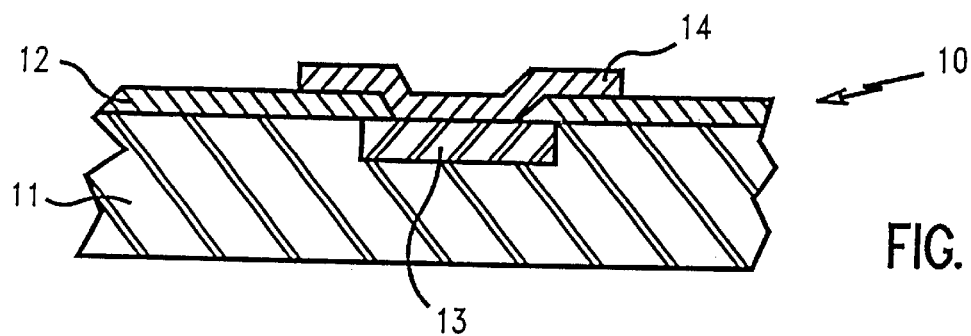
FIGS. 1A–1E show a method for forming a solder structure of the invention and using the solder structure to bond a pad on a chip to a pad on a substrate.

In describing the preferred embodiment of the present invention, reference will be made herein to FIGS. 1–3 of the drawings in which like numerals refer to like features of the invention. Features of the invention are not necessarily shown to scale in the drawings.

Any suitable solder of the prior art may be used to make a solder column structure of the invention. Preferably the solder is a solder commonly termed a binary solder and comprises, by weight, about 1—5%, tin, preferably about 3% tin, and the balance essentially lead including the usual impurities. Pure lead is preferably used. A specific alloy which is preferred because of its demonstrated effectiveness is a solder containing about 3% by weight tin and the balance essentially lead.

The solder column structure of the invention may be formed using any suitable forming method. A preferred method employs melting (casting) a pre-measured or pre-weighed amount of solder into mask cavities and cooling the mixture to form the solder in solid form. The reflow (melting) temperature is about 350°–360° C. for the 3% tin solder.

In general, one method of forming a tall C-4 solder column structure is by the use of graphite boats or forms which feature perforated cylindrical holes with a height equal to the desired height of the solder column. The holes are aligned with the C-4 BLM metallization pads on the chip or wafer. Solder wires of the proper Pb—Sn composition, i.e., Pb-3% Sn, are inserted into the holes and reflowed at about 350° C., thus forming a cast column whose base has reacted with the BLM thin metal film pads during reflow, forming a strong bond between the pads and the base of the column through the formation of intermetallics between Sn and the reacting metals of the BLM. There is no indium at this joint and the solder column structure is bonded (attached) to the pads of the substrate.

Another approach comprises injecting molten solder (IMS process) into the cavities/holes as shown in U.S. Pat. No. 5,244,143 rather than employing preformed wires. Both of these approaches are adaptable or directly usable for the casting of tall C-4's as proposed herein.

After reflowing and forming the solder column structure on the substrate, the indium or other metal alloying layer is added. Any thickness layer may be used which leads to the formation of a ductile ternary alloy joint, e.g., Pb—Sn—In. During chip joining, the joint formation occurs at a temperature lower than that of the reflow temperature used to make the solder structure bonded to the BLM pad. The thickness of indium or other metal layer can vary up to 1 mil or higher, e.g., 0.5 to 2 mil for most applications, independent of the size of the interconnection in terms of column height and diameter. Indium melts at about 155° C. and chip-joining can be easily effected at reflow temperatures ranging from for example 200° C. to 250° C. with excellent wettability. At chip-joining, lead and tin start to dissolve (melt) together into the molten indium. The dissolution process continues until the lead-tin level of the ternary alloy reaches the level at which the ternary alloy solution solidifies. It is an important feature of one aspect of the invention that the ratio of lead to tin (Pb/Sn) in the ternary is substantially the same as that in the Pb—Sn binary. This has been found when the tin level of the solder is below about 3%. When the Pb—Sn solder column dissolves into the molten indium, it does so uniformly at the Sn—Pb ratio of the solder, since it is hypothesized that upsetting that ratio would require Sn or Pb diffusion within the solid alloy, which is infinitesimally slow relative to the dissolution kinetics. The solidification temperature, therefore, determines the composition of the joining ternary alloy. Given that the binary solder alloy, i.e., Pb-3% Sn, dissolves (melts) at a fixed compositional ratio, the resulting ternary alloy at solidification has the same composition at a given chip-joining temperature regardless of the thickness of the indium layer (which is typically much smaller than the height of the binary solder column). If the indium layer is made thicker, the resulting ternary joint will be consequently thicker in direct proportion. Thus, one can make a thinner or thicker ternary joint by varying the thickness of the indium layer, which can be made by evaporation, plating or application as a paste to the solder column.

To alter the composition of the ternary joint, the chip joining temperature must be altered. To remelt the joint, therefore, the temperature must just exceed the temperature at which the chip was joined. The mechanical and chemical properties of the ternary alloys thus formed are therefore in a practical range of temperatures demanded by the process. Consequently, one can adjust the joining temperature to allow remelting at some convenient temperature or to prevent remelting by a subsequent process step. This latitude is important in terms of cost and ability to overcome hierarchical temperature sequences during the assembly fabrication process. Again, this is possible because the ternary alloys formed are preferably a one solid solution, though of varying composition, and consistent with respect to properties relevant to fatigue and corrosion.

Figure 1B:
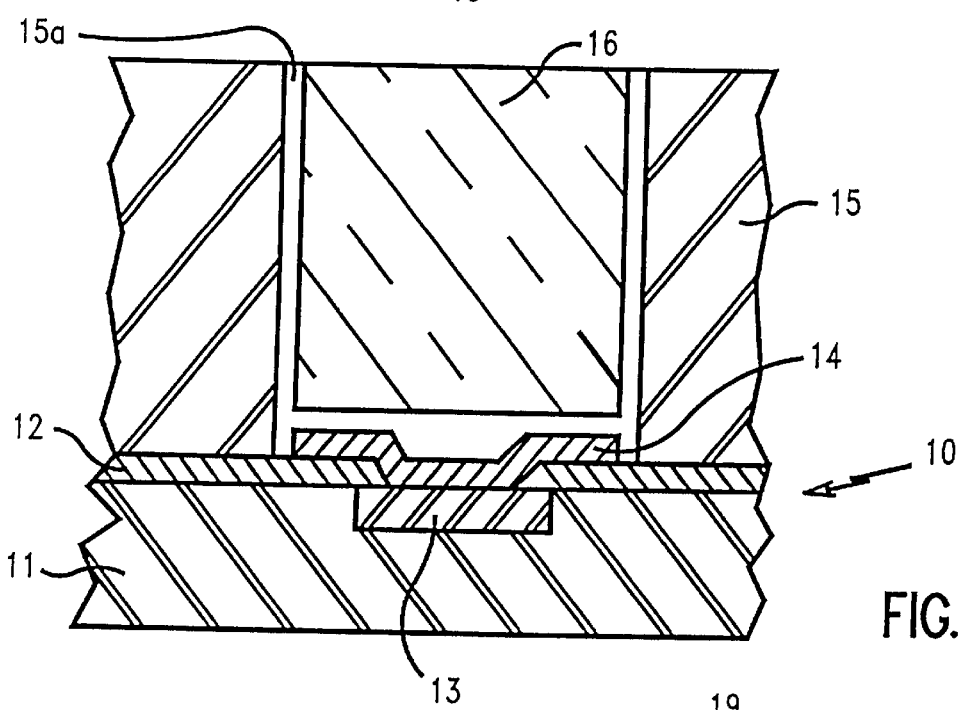

Referring to FIGS. 1A–1E, the formation of a solder column structure of the invention and use of the column to join two substrates is shown. In FIG. 1A, a first substrate generally indicated as 10 comprises a first base substrate 11 and a silicon oxide layer 12. Substrate metallization 13 has a BLM pad 14 formed thereon. In FIG. 1B, a mold 15 having an opening 15a is positioned on the surface of layer 12, with the opening 15a corresponding and registering with BLM pad 14. A 3% Sn weight percent Pb—Sn solder alloy wire 16 is shown inserted in opening 15a.

Figure 1C:
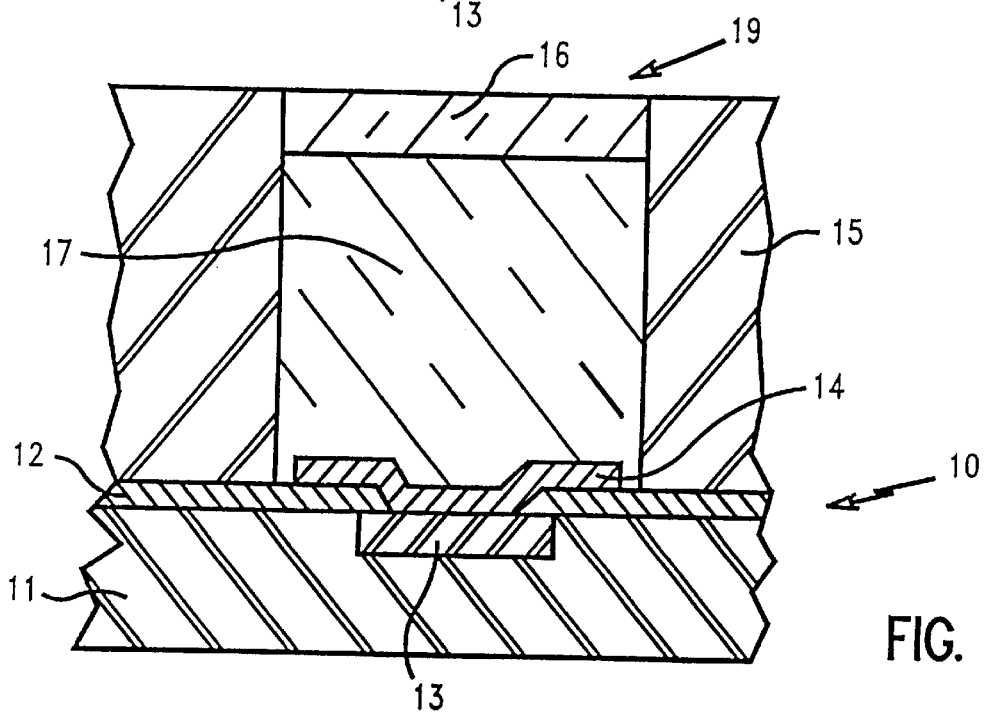
Figure 1D:
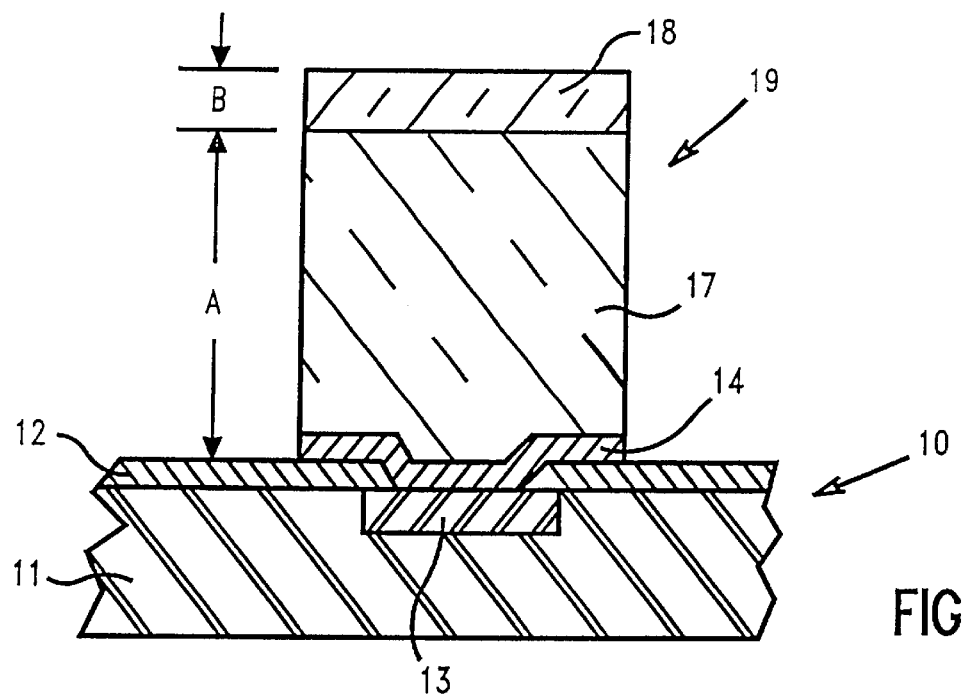
Figure 1E:
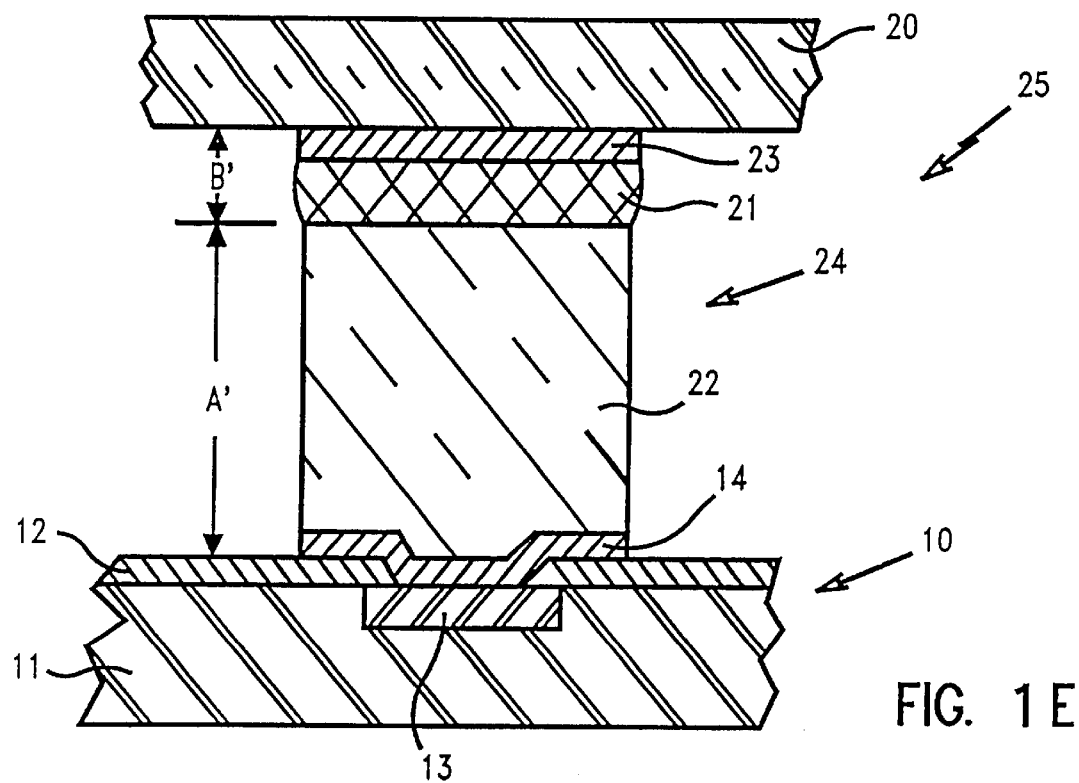

The structure of FIG. 1B is reflowed melting the solder alloy wire 16 partially filling the mold opening 15a with a reflowed solder column 17 as shown in FIG. 1C. A layer of indium 18 is shown filling the opening 15a to the top of mold 15 forming the solder column structure 19 of the invention. The column structure 19 is bonded to BLM 14 as shown in FIG. 1D. The height of column structure 19 is the sum of the height A of reflowed solder column 17 and height B of indium layer 18. A in this example is about 5 mils and B is about 0.7 mils.

The solder column structure 19 shown in FIG. 1D is used to join the pad 23 of a second substrate 20 by reflowing at 230° C. forming a joined assembly 25. After reflow, the interconnection 24 has a solder column height A' shown as 22 and is now about 4.25 mils high and the ternary alloy joint height B' shown as 21 is about 1.2 mils high. The solder column 22 is still the original binary solder having a composition of 3% by weight Sn-balance lead. The ternary solder joint 21 has a composition, by weight, of about 40% indium, 1.8% tin and the balance lead.

Figure 2:
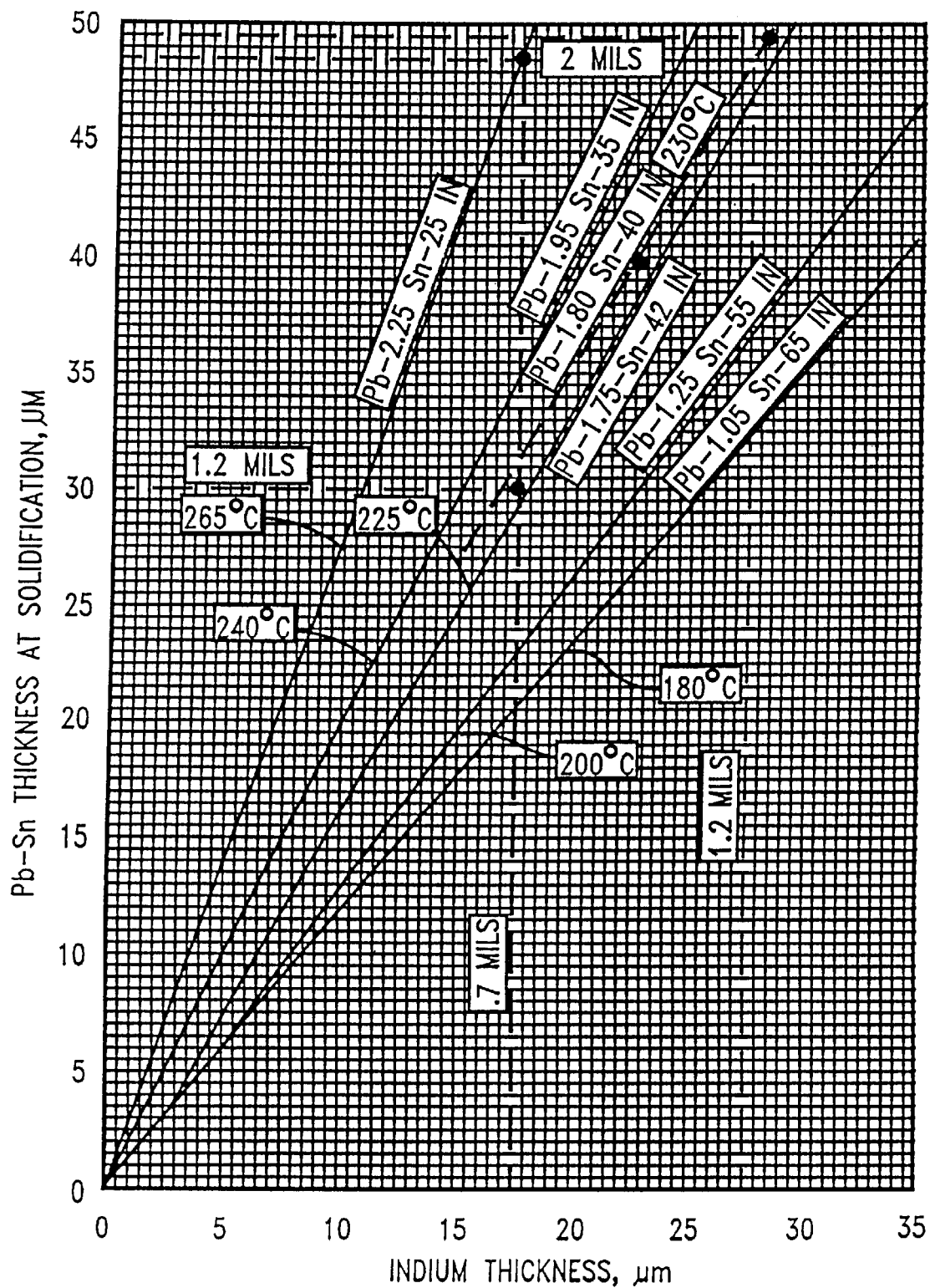
FIG. 2 is a graph showing the Pb—Sn—In ternary alloy joint thickness and alloy composition formed after reflow versus the indium layer thickness on the solder column for different reflow temperatures ranging from 180° C. to 265° C.

FIG. 2 shows a graph of the reflow formed Pb—Sn—In ternary alloy joint thickness at solidification versus the indium layer thickness for different reflow temperatures ranging from 180° to 265° C. The ternary alloy composition differs for each temperature, i.e. Pb-1.05Sn-65In at 180° C. to Pb-2.25Sn-25In at 265° C. independent of the initial indium layer thickness. For example, as shown in FIGS. 1A–1E a 0.7-mil layer of indium produces a 1.2 mil (30 micrometers) thick joint of a Pb-1.8Sn-38In ternary alloy at 230° C. If the reflow temperature is raised to 265° C., the ternary alloy joint thickness is about 1.94 mils or 48.5 micrometers at a composition of Pb-2.25Sn-25In. At a 230° C. reflow temperature, the ternary alloy composition remains fixed as the thickness of the indium layer is varied, which changes the ternary joint thickness proportionally. Thus, at the same reflow temperature, increasing the indium from 0.7 mil to 1.2 mils leads to a proportional increase in the ternary layer from 1.2 to 2 mils.

Figure 3:
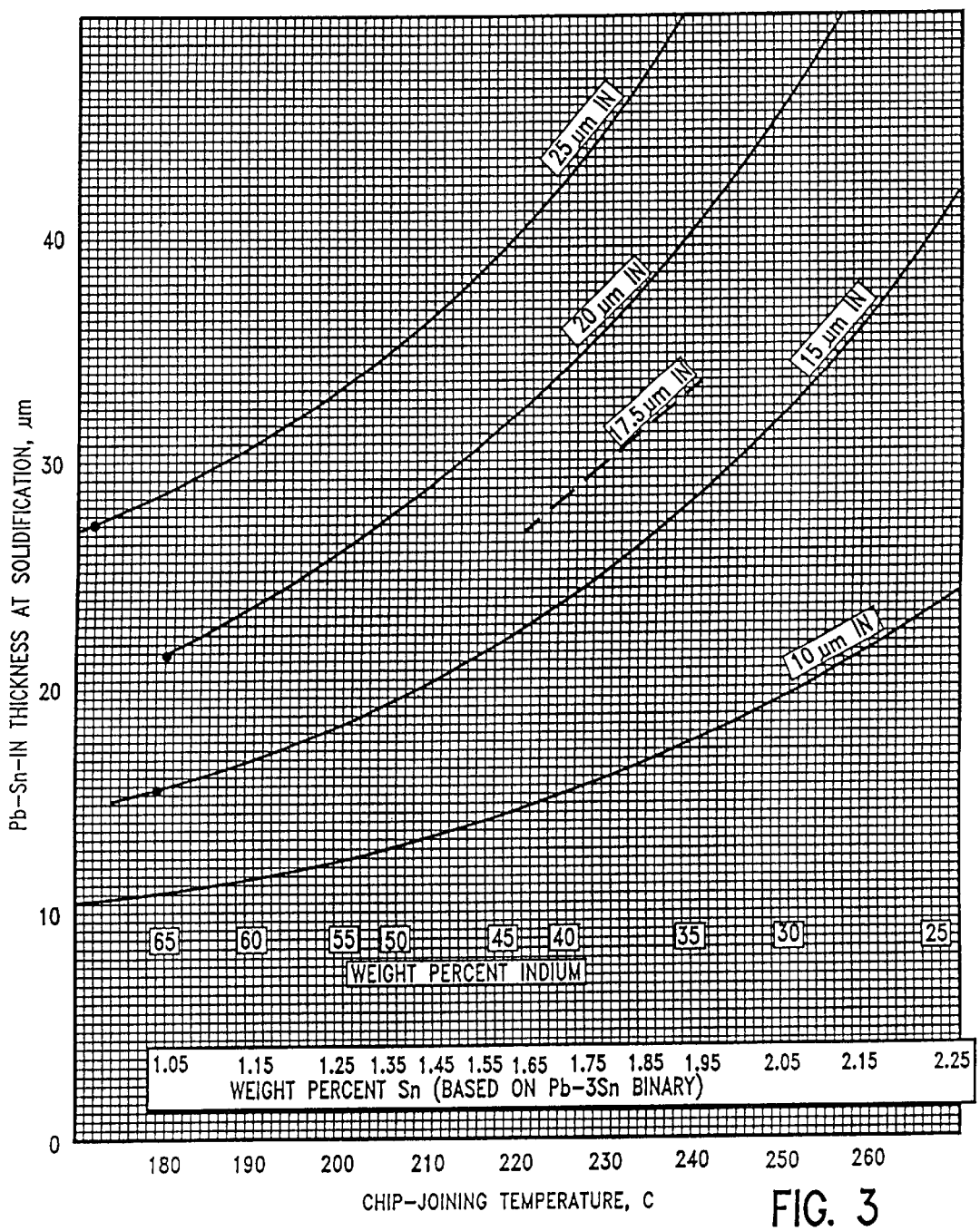
FIG. 3 is a graph showing the Pb—Sn—In ternary alloy joint thickness formed after reflow versus the reflow temperature at various indium layer thickness on the solder column structure. The composition of the formed ternary alloy is also shown.

FIG. 3 shows the ternary alloy joint thickness at solidification in micrometers (microns) versus the chip-joining temperature for different indium thicknesses ranging from 10 to 25 micrometers. The graph also shows the Sn and In concentrations associated with each temperature in two separate scales.

It is an important feature of the invention that the composition and thickness of the ternary alloy joint can be controlled at any temperature by the proper choice of the indium thickness and reflow temperature, according to the alloy thermodynamics. The ternary alloy solidifies at the reflow temperature when it reaches the proper composition as more Pb—Sn alloy dissolves (melts) into the liquid (molten) metal phase. The reflow temperature dictates the composition while the initial indium thickness determines the final thickness of the ternary alloy at the joints. Therefore, an infinite number of choices can be made by varying the reflow temperature and the indium thickness independently. The important thing to be emphasized for the ternary alloy is that for the example shown, it is basically a single-phase alloy for levels of tin below 3% independent of the indium concentration; that is, if the Pb—Sn alloy making up the column is a single phase, the indium will not alter that and will form a single phase with the solder. The advantage of this system is that the mechanical properties (foremost fatigue properties) of the ternary joint are at least as good as those of the binary (Pb-3Sn) alloy assuring that the strain during thermal cycle fatigue is evenly distributed thus preventing high local strains due to the abrupt variations in the mechanical properties and heterogeneities, which results, for example, when a Pb—Sn eutectic alloy is joined with high-lead Pb—Sn binaries. The binary alloy strength, stiffness, and hardness generally increases with tin content, and its ductility degrades when alloyed with the high-tin Pb—Sn eutectic alloy. On the other hand, the composition range of the Pb—Sn—In ternary alloy joints for a wide range of chip-joining temperatures will have fatigue and corrosion resistance at least as good as the Pb-3Sn column. Further electromigration problems are not a concern as with the solder joints. In fact, this problem is not particularly relevant since there is no In in the BLM side of the assembly which is most vulnerable to electromigration due to the small size of the via where the electron current (electron wind) flows from the BLM into the solder and solder depletion occurs due to flux divergence at the boundary. But the BLM side does not contain In and therefore electromigration is minimal. In any event, there would still be no concern since the indium-bearing ternary alloy is substantially as resistant to electromigration as the Pb-3Sn binary. Note that with this ternary alloy system of the invention substrates can be joined at any temperature above the indium melting point which satisfies the thickness and composition desired, and a subsequent temperature cycle peaking at a lower temperature will not remelt the prior joint and will not impair its key properties.

The flexibility and consistency of the ternary solder joint is hypothesized to be the result of a single phase which assures homogeneity and isotropic properties throughout the ranges of compositions that are covered in the process and the temperatures that prevail in the fabrication of the assembly. The proposed ternary alloy system and associated process will achieve fatigue enhancement as high as a factor of ten to twenty-five (depending on the aspect ratio) for tall solder columns as a result of the ductile properties of the ternary alloy formed at the joints independent of the joining temperature and final composition.

It has been found that using the solder of the invention provides soldered joints such as C-4 joints to have an extended fatigue life compared to solder joints made with solder columns of the prior art. The fatigue enhancement in terms of fatigue life at the tolerance fail level is generally more than two to three times the prior art alloys which are commonly used to make solder joints.

Another benefit of the invention is that the extended fatigue life of the solder joints is attained both with and without the need for module hermeticity and/or with and without an epoxy underfill. Sealing of the module and/or the use of epoxy underfill is generally used to extend the life of the component and the use of the ternary solder with its enhanced fatigue life obviates the need for such techniques to increase the life of the electronic component. If such techniques are employed using the solder of the invention even more enhanced component life properties would be achieved.

It is also contemplated herein that other metals such as antimony may be used to form a ternary alloy. Also, multiple metal layers or mixed metal layers may be used to form alloys with the melting solder column. While the formation of a single phase bonding alloy (ternary, quatenary, etc.) is preferred, multi-phase alloys may also be formed and employed as the bonding joint.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An electronic component assembly containing a solder structure in the form of a column which, when used to bond a first and second electronic substrate together, forms an enhanced fatigue resistant solder bond the solder column structure comprising a solder comprising less than about 3% by weight tin, the balance lead, the column having at one end the solder forming the column and at the other free end thereof a layer of metal thereon which metal forms a single phase ternary alloy with the solder when the solder column is reflowed, the solder column being attached at the solder and to one of a plurality of pads or other bonding sites on the first electronic substrate to be joined, and, when the solder column structure is to be reflowed to join the solder column to the second substrate to be joined, the metal layer free end portion of the solder column is positioned proximate the corresponding pad or other bonding site on the second substrate with the proviso that the ratio of lead to tin in the ternary alloy is about the same as in the solder, the assembly being made by the method comprising the steps of:

applying solder to metallized pads on the surface of a first substrate of the electronic component assembly and forming a column solder structure which structure is bonded to the pads;

forming a layer of metal on the non-bonded end of the solder structure which metal melts during a reflow cycle to allow the column to bond pads on a second substrate to the corresponding pads on the first substrate and which metal forms a ternary alloy with the solder of the solder structure;

positioning the pads on the surface of the second substrate of the electronic component assembly to be joined proximate to the ends of the solder columns of the corresponding pads on the first substrate;

heating the substrates to a temperature sufficient to melt the metal and part of the solder column forming a solder-metal ternary alloy and alloy bond between the solder structure and the pads on the second substrate; and cooling the bonded interconnected assembly.

2. The assembly of claim 1 wherein the layer of metal is indium.

3. The assembly of claim 2 wherein the solder comprises, by weight, about 1–3% tin and the balance essentially lead.

4. The assembly of claim 3 wherein the solder contains about 3% by weight tin.

5. The assembly of claim 3 wherein the height of the solder structure is up to about 10 mils.

6. The assembly of claim 5 wherein the first substrate is a multilayer ceramic substrate and the second substrate is a chip.

* * * * *